(12) United States Patent
Okada et al.

(10) Patent No.: US 6,788,361 B2
(45) Date of Patent: Sep. 7, 2004

(54) ELECTRO-CONDUCTIVE LIQUID CRYSTAL ELEMENT AND ORGANIC ELECTRO-LUMINESCENCE ELEMENT

(75) Inventors: Shinjiro Okada, Kanagawa (JP); Akira Tsuboyama, Kanagawa (JP); Takao Takiguchi, Kanagawa (JP); Takashi Moriyama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 112 days.

(21) Appl. No.: 10/143,793

(22) Filed: May 14, 2002

(65) Prior Publication Data

US 2002/0171787 A1 Nov. 21, 2002

(30) Foreign Application Priority Data

May 15, 2001 (JP) ........................................ 2001-144120

(51) Int. Cl.[7] .................... G02F 1/1333; G02F 1/1335; H01J 1/62

(52) U.S. Cl. ........................... 349/86; 349/69; 313/504; 313/506

(58) Field of Search ............................ 349/69, 86, 122; 313/500–506

(56) References Cited

U.S. PATENT DOCUMENTS

| | | | | |
|---|---|---|---|---|
| 5,748,271 A | * | 5/1998 | Hikmet et al. ............... | 349/69 |
| 5,750,214 A | | 5/1998 | Ito et al. ....................... | 428/1 |
| 5,858,273 A | | 1/1999 | Asaoka et al. ............. | 252/299.4 |
| 5,973,761 A | | 10/1999 | Gofuku et al. ............. | 349/128 |
| 6,128,064 A | | 10/2000 | Moriyama et al. .......... | 349/173 |
| 6,139,927 A | | 10/2000 | Takao et al. ................ | 428/1.26 |
| 6,154,265 A | | 11/2000 | Kamio et al. ............... | 349/122 |
| 6,221,444 B1 | | 4/2001 | Okada et al. ............... | 428/1.25 |
| 6,249,085 B1 | * | 6/2001 | Arai ............................. | 313/506 |
| 6,252,641 B1 | | 6/2001 | Tsuzuki et al. ............. | 349/122 |
| 6,528,940 B1 | * | 3/2003 | Okada et al. ............... | 313/505 |
| 2001/0041270 A1 | * | 11/2001 | Maruyama et al. .......... | 428/690 |
| 2002/0037432 A1 | * | 3/2002 | Park et al. ................... | 428/690 |
| 2002/0063502 A1 | * | 5/2002 | Wu ............................. | 313/112 |
| 2002/0135292 A1 | * | 9/2002 | Kamatani et al. ........... | 313/483 |

OTHER PUBLICATIONS

F. Cacialli, et al., "Efficient Green Light–Emitting Diodes from a Phenylated Derivative f Poly(p–phenylene–vinylene)", Appl. Phys. Lett., vol. 69, No. 25, pp. 3794–3796 (1996).

J. Bharathan, et al., "Polymer Electroluminescent Devices Processed by Inkjet Printing: I. Polymer Light–Emitting Logo", Appl. Phys. Lett., vol. 72, No. 21, pp. 2660–2662 (1998).

S. Chang, et al., "Dual–Color Polymer Light–Emitting Pixels Processed by Hybrid Inkjet Printing", Appl. Phys. Lett., vol. 73, No. 18, pp. 2561–2563 (1998).

M. Funahashi, et al., "Anomalous High Carrier Mobility in Smectic E Phase of a 2–Phenylnaphthalene Derivative", Appl. Phys. Lett., vol. 73, No. 25, pp. 3733–3735 (1998).

J. Hanna, et al., Appl. Phys., vol. 68, No. 1, pp. 26–32 (1999).

D. Braun, et al., "Visible Light Emission from Semiconducting Polymer Diodes", Appl. Phys. Lett., vol. 58, No. 18, pp. 1982–1984 (1991).

D. Adam, et al., "Fast Photoconduction in the Highly Ordered Columnar Phase of a Discotic Liquid Crystal", Nature, vol. 371, pp. 141–143 (1994).

(List continued on next page.)

Primary Examiner—Tarifur R. Chowdhury
(74) Attorney, Agent, or Firm—Fitzpatrick, Cella, Harper & Scinto

(57) ABSTRACT

A polymer type organic EL element is improved in terms of the stability and the efficiency and intensity of light emission. A carrier injection layer made of discotic liquid crystal or smectic liquid crystal having an electron resonance structure is interposed between a polymer layer and an electrode.

5 Claims, 1 Drawing Sheet

OTHER PUBLICATIONS

I.H. Stapff, et al., "Preliminary Communication: Multilayer Light Emitting Diodes Based on Columnar Discotics", Liquid Crystals, vol. 23, No. 4, pp. 613–617 (1997).

T. Christ, et al., "Columnar Discotics for Light Emitting Diodes", Adv. Mater., vol. 9, No. 1, pp. 48–52 (1997).

G. Lussem, et al., "Liquid Crystalline Materials for Light–Emitting Diodes", Polym. Adv. Technol., vol. 9, pp. 443–460 (1998).

V.E. Choong, et al., "Investigation of the Interface Formation between Calcium and Tris–(8–hydroxy quinoline) Aluminum", Appl. Phys. Lett., vol. 72, pp. 2689–2691 (1998).

* cited by examiner

ELECTRO-CONDUCTIVE LIQUID CRYSTAL ELEMENT AND ORGANIC ELECTRO-LUMINESCENCE ELEMENT

BACKGROUND OF THE INVENTION

1. Field of the Invention

This invention relates to an electro-conductive liquid crystal element to be applied to electronic devices and an organic electro-luminescence element (to be referred to as "organic EL element" herein after) utilizing such a liquid crystal element.

2. Related Background Art

Of organic EL elements, carrier-injection type EL elements were studied in-depth particularly in terms of organic solids such as anthracene single crystal in the 1960s. Such elements were of the single layer type. Thereafter, Tang et al. proposed multilayer type organic EL elements comprising a luminescent layer and a hole transport layer between a hole injection electrode and an electron injection electrode. Injection type EL elements commonly have a light emitting mechanism including stages of:

electron injection from the cathode and hole injection from the anode;

movement of electrons and holes in solid;

recombination of electrons and holes; and light emission from singlet excitons.

A typical multilayer type organic EL element is prepared by forming an ITO film on a glass substrate as anode, forming thereon TPD (N,N-diphenyl-N,N-di(3-methylphenyl)-1,1-biphenyl-4,4-diamine) to a thickness of about 50 nm, forming thereon Alq3 (tris-(8-quinolaritho) aluminum) to a thickness of about 50 nm and depositing an Al—Li alloy thereon by evaporation as cathode. Injection of holes to the TPD can be facilitated when 4.4 to 5.0 eV is selected for the work function of the ITO used for the anode, whereas a metal material that is stable and has a small work function is selected for the cathode. Typically, an alloy of Al and Li or Mg and Ag is used. With this arrangement, the element emits green light when a DC voltage between 5 and 10V is applied thereto.

It is also known to use electro-conductive liquid crystal for the carrier transport layer. For example, "Nature", Vol. 371, P. 141, D. Adam et al. reports that the mobility of discotic liquid crystal that is a long chain triphenylene type compound is between $10^{-3}$ and $10^{-2}$ cm$^2$/Vsec in the liquid crystal phase (Dh phase) and $10^{-1}$ cm$^2$/Vsec in the mesophase (intermediary phase—not liquid crystal phase). In the case of rod-shaped liquid crystal, "Applied Physics", Vol. 68 [1], Hanna, J., p. 26 reports that the mobility of phenylnaphthalene type smectic B phase is $10^{-3}$ cm$^2$/Vsec or more.

"Liquid Crystals", 1997, Vol. 23 [4] INGAH. STAPFF et al. pp. 613–617 reports an organic EL element using triphenylene type discotic liquid crystal that is designed in an attempt for using such liquid crystal for electro-luminescence. "POLYMERS FOR ADVANCED TECHNOLOGIES", 1998, Vol. 19, pp. 443–460 and "ADVANCED MATERIALS", 1997, Vol. 19 [1], p. 48 also report the use of liquid crystal for electroluminescence.

Meanwhile, Friend et al. of Cambridge University reported organic EL elements (polymer type EL elements) realized by using a polymer material in 1990. It may be safe to say that the mechanism of operation of these polymer type EL elements is essentially the same as that of known EL elements made of a low molecular weight material (low molecular weight type EL elements), the difference being only in the molecular weight of the organic material and the film forming method. Polymer type EL elements can be prepared by using a wet film forming method such as spinner coating. While polymer type EL elements are inferior to low molecular weight type EL elements including those proposed by Tang et al. in terms of the intensity and efficiency of light emission, unlike the latter, they provide advantages such that it is possible to use a wet process for preparing them. Materials that can be used for polymer type EL elements include conjugated polymers such as polyparaphenylene-vinylene (PPV) and polyfluorene, soluble poly-2-methoxy-5-(2-ethylhexyloxy)-1,4-phenylene-vinylene (MEH-PPV) that is produced by introducing substituents to PPV, as well as polyvinylcarbazole (PVK) having a structural formula as shown below whose side chains are active and show a high carrier transport characteristic although its main chain is electrically inactive.

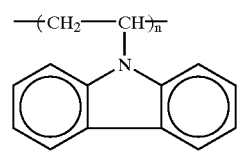

PVK

As pointed out above, known polymer type EL elements are inferior to low molecular weight type EL elements in terms of the intensity and efficiency of light emission. However, a method of improving the luminance and the efficiency of light emission by replacing the aluminum of the cathode by calcium is known (D. Braun, A. J. Heeger, Appl. Phys. Lett., 58, 1982, 1991). When the aluminum of the cathode is replaced by calcium, the work function falls from 4.2 eV to 3.0 eV to make it easy to inject electrons. Metals such as calcium whose work function is low are reducing and highly reactive so that the calcium in the polymer shows a state of being polymer-doped at and near the interface and hence it may be safe to assume that the electron barrier is made low (J. M. Bharathan, Y. Yang, Appl. Phys. Lett., 72, 2689, 1998). However, a calcium electrode is very unstable and its service life is extremely short.

There is known a method of injecting holes from the anode that utilizes an electro-conductive polymer such as polyaniline or polythiophene as a buffer layer for improving the injection efficiency. However, the anode is normally made of ITO and its surface shows undulations. Therefore, the technique of forming a polymer film on the ITO electrode does not give rise to a good result in terms of adhesiveness and bonded area.

As described above, while polymer type EL elements provide advantages relative to low molecular weight type EL element in terms of manufacturing process, neither the interface with the cathode nor that with the anode allows carriers to be injected satisfactorily through them partly because of the strong film forming characteristic of the polymer material. As a result, polymer type EL elements are inferior to low molecular weight EL elements in terms of the stability (service life) of elements and the efficiency and intensity of light emission.

The electronic structure of organic EL elements is such that no thermally excited free carriers exist because of the energy gap is as large as about 3 eV and the carriers injected from the electrodes form an electric current (space charge limiting current). Therefore, the efficiency of injecting carriers from the electrodes is a serious problem. If the injection efficiency is low, a high voltage needs to be applied in order to provide a necessary amount of electric current and thereby the thickness of layers of the element needs to be reduced. Then, a short-circuiting can occur between the electrodes and the capacitive load of the element has to be increased.

SUMMARY OF THE INVENTION

In view of the above circumstances, it is therefore the object of the present invention to provide an organic EL element of the polymer type that is advantageous in terms of manufacturing process and operates as excellently as low molecular weight type EL elements in terms of the stability and the efficiency and intensity of light emission.

According to the invention, the above object is achieved by providing an electro-conductive liquid crystal element comprising a pair of oppositely disposed electrodes, an electro-conductive liquid crystal layer formed so as to contact at least one of the electrodes, said electro-conductive liquid crystal layer having in the molecular structure thereof an electron resonance structure and a temperature region showing a liquid crystal phase, and an electro-conductive polymer layer formed so as to contact the electro-conductive liquid crystal layer.

DESCRIPTION OF THE PREFERRED EMBODIMENTS

Figure 1:
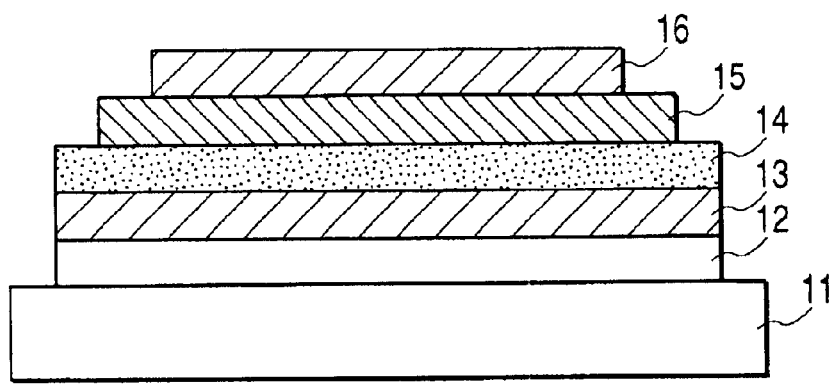
FIG. 1 is a schematic cross sectional view of an embodiment of organic EL element according to the invention.

A high electric field (10V/100 nm) is required for driving a polymer type EL element and the element needs to have a calcium electrode because:

the mobility of carriers (holes and electrons) is low in the organic layers; and the efficiency of injection of carriers from the electrodes to the organic layers is low.

Since the band gap of the organic compound to be used for organic EL elements is as broad as about 3.0 eV, no thermally excited free electrons exist in the conduction band (LUMO: lowest unoccupied molecular orbital) and the electric current is exclusively provided by the tunneling current injected from the electrodes. While it is known that the efficiency of injection from the electrodes depends not only on the work efficiency of the electrodes and the level gap between LUMO and HOMO (highest occupied molecular orbital) of the organic compound but also significantly on the molecular arrangement and the structure of the organic compound. In the case of organic compounds (e.g., TPD, NPD, TAZ-1, Alq3) that are used for ordinary EL elements, a high electric field needs to be applied to the bonding interfaces between the organic compound layers and the electrodes in order to provide a sufficient amount of electric current. Another reason that a high electric field needs to be applied is that the carrier mobility of the organic compound is as low as about $10^{-3}$ cm$^2$/Vsec.

According to the invention, these problems are dissolved by using an electro-conductive liquid crystal layer for the carrier injection layer. Now, the function of such an electro-conductive liquid crystal layer will be described below.

(1) There are electro-conductive liquid crystals that show a mobility exceeding $10^{-2}$ cm$^2$/Vsec (Nature, Vol. 371, D. Adam et al., p. 141).

(2) Electro-conductive liquid crystal is orientable because a phase transfer can occur in the electro-conductive liquid crystal to show a liquid crystal phase of lower degree such as a nematic phase or a discotic disordered phase depending on temperature. Therefore, it is possible to orient liquid crystal molecules on an electrode surface.

(3) While discotic liquid crystal is made to show liquid crystal characteristics by forming side chains around the core that is typically triphenylene, the side chains poorly wet the surface of a metal substrate (including ITO) and the core such as triphenylene is oriented relative to the electrode surface in the liquid crystal state. Therefore, the electron conjugation plane of the core is oriented at the electrode surface to provide an effect of facilitating the reception of carriers from the electrode. For this reason, it is possible to raise the efficiency of carrier injection if compared with ordinary polymer compounds and organic compounds in an amorphous state. In this way, it is possible to raise the efficiency of injecting carriers into the polymer layer from the electrodes by orienting the discotic liquid crystal having hydrophobic side chains at the metal surface (including ITO). This effect can also be expected in the case of ordinary rod-shaped liquid crystal if its phenyl group or naphthalene group is oriented. It may sometimes be possible to promote the injection of carriers from the electrode when interface states are formed by the liquid crystal molecules that are found along the interface.

When liquid crystal is used for the carrier transport layer, a film forming technique such as evaporation or spin coating using liquid crystal dissolved in a solvent can be employed. The liquid crystal layer that is formed by evaporation can be oriented easily during and immediately after the evaporation process because the thin film formed by evaporation is coarse and hence probably liquid crystal molecules can be reoriented easily at the temperature of liquid crystal phase. A liquid crystal phase of a higher degree that is highly organized shows a low mobility and hence can hardly be oriented. Heating such liquid crystal to an isotropic phase for the purpose of reorientation is not desirable for the element because such liquid crystal in a liquid state can easily dissolve other materials.

(4) The molecular arrangement of liquid crystal molecules can be rearranged on the electrode surface by subjecting the liquid crystal to a reorientation process (post-treatment) in order to improve the carrier injection efficiency.

In an electro-conductive liquid crystal element according to the invention, an electro-conductive liquid crystal layer is interposed as carrier injection layer between the electro-conductive polymer layer and the corresponding electrode to provide the above listed functional advantages. Thus, according to the invention, there is provided a polymer type EL element that operates as excellently as low molecular weight type EL elements in terms of the stability and the efficiency and intensity of light emission. The effects of combining an electro-conductive liquid crystal layer and an electro-conductive polymer layer according to the invention can be applied not only to organic EL elements but also to other electronic devices. Therefore, the present invention also provides electronic devices comprising an electro-conductive liquid crystal element realized by using such a combination. Electric devices that can be realized according to the invention include photo-sensors, photoconductors (e.g. drums of copying machines), organic semiconductor elements (organic thin film transistors), temperature sensors and space modulation elements.

An electro-conductive liquid crystal element according to the invention essentially comprises a pair of electrodes (anode, cathode), an electro-conductive liquid crystal layer and an electro-conductive polymer layer. Now, each of the components will be specifically described below.

Electro-conductive liquid crystal that can be used for the purpose of the invention has in the molecular structure thereof an electron resonance structure and is preferably discotic liquid crystal or smectic liquid crystal.

Examples of electron resonance structure that can be used for the purpose of the invention include triphenylene, naphthalene and benzene ring as well as pyridine ring, pyrimidine ring, pyridazine ring, toropolone ring, azulene ring, benzofuran ring, indole ring, indazole ring, benzothiazole ring, benzooxazole ring, benzoimidazole ring, quinoline ring, isoquinoline ring, quinazoline ring, quinoxaline ring, phenanthrene ring and anthracene ring.

The core structure of discotic liquid crystal to be used for the purpose of the invention may be selected from triphenylene structure and the above described structures, as well as from toruxene skeleton, metal-phthalocyanine skeleton, dibenzopyrene skeleton, metal-naphthalocyanine structure, dibenzopyrene skeleton and the hexabenzocoronene structure to name the few.

Materials that can be used for the anode for the purpose of the invention include ITO (indium/tin oxide) that has been popularly used, indium oxide, tin oxide, $Cd_2SnO_4$, zinc oxide, copper iodide, gold and platinum. On the other hand, materials that can be used for the cathode for the purpose of the invention include alkali metals, alkaline earth metals and alloys of alkali and alkaline earth metals such as sodium, potassium, magnesium, lithium, sodium/potassium alloys, magnesium/indium alloys and magnesium/silver alloys, aluminum, aluminum/lithium alloys, aluminum/copper alloys and aluminum/copper/silicon alloys.

Electro-conductive polymer materials that can be used for the purpose of the invention include PVK that is a hole transport material, MEH-PPV, poly-3-alkylthiophene, polynaphthalene-vinylene, poly-p-phenylene-vinylene and poly-9-alkylfuluorene. For the purpose of the present invention, it is possible to orient the liquid crystal molecules of the electro-conductive liquid crystal layer by subjecting the electro-conductive polymer layer, on which the electro-conductive liquid crystal layer is formed, to a rubbing process.

When forming an organic EL element according to the invention, it is possible to make the electro-conductive polymer layer operate as luminescent layer or form another luminescent layer. If another luminescent layer is formed, the electro-conductive polymer layer is used as carrier transport layer. If the electro-conductive polymer layer is made to operate as luminescent layer, an electro-conductive polymer that has a light emitting ability may be used. Alternatively, a luminescence center substance may be dispersed into the polymer layer that does not have any light emitting ability. Polymers having a light emitting ability include conjugate polymers such as PPV, PPP and polyfluorene. Polymers into which a luminescence center substance can be dispersed include non-conjugate polymers having a weak light emitting ability such as PVK. Substances that can be used as luminescence center substance and adapted to be dispersed into the polymer layer include ordinary fluorescent coloring matters such as DCM and phosphorescent coloring matters.

When a luminescent layer is formed beside the electro-conductive polymer layer, light emitting materials that can be used for the luminescent layer include Alq3, BeBq [bis(benzoquionolinolato)beryllium complex], DTVBi[4,4-bis(2,2-di-p-tolyl-vinyl)-biphenyl], $Eu(DBM)_3(Phen)$[tris(1,3-diphenyl-1,3-propanediono)(monophenanthroline)Eu (III), diphenylethylene derivatives, triphenylamine derivatives, diamino carbazole derivatives, bisstilyl derivatives, benzothiazole derivatives, benzoxazole derivatives, aromatic diamine derivatives, quinacridone type compounds, perylene type compounds, oxadiazole derivatives, coumalin type compounds and anthraquinone derivatives.

Figure 2:
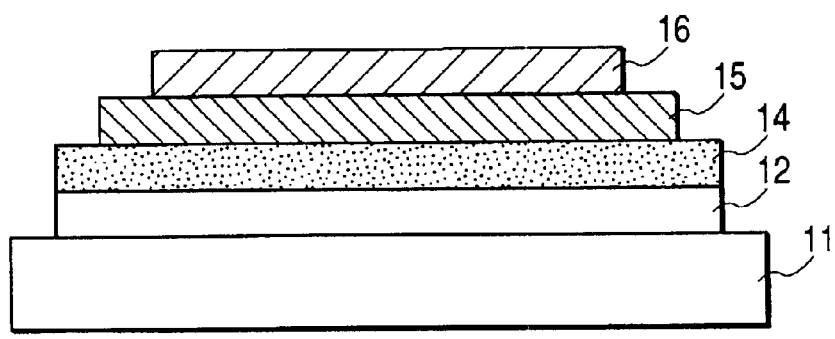
FIG. 2 is a schematic cross sectional view of another embodiment of organic EL element according to the invention.

FIGS. 1 and 2 show schematic cross sectional views of preferred embodiments of organic EL element according to the invention. In each of FIGS. 1 and 2, there are shown a glass substrate 11 that is used whenever necessary, an anode 12, an electro-conductive liquid crystal layer 13 that operates as hole injection layer, an electro-conductive polymer layer 14 that operates as luminescent layer, an electro-conductive liquid crystal layer 15 that operates as electron injection layer and a cathode 16. With either of these arrangements, the anode 12 is made of ITO and emitted light is taken out from the anode 12.

EXAMPLES
Example 1

An organic EL element having a configuration as shown in FIG. 1 was prepared. A target of In 90% and Sn 10% was used on a glass substrate and an ITO film was formed as anode by sputtering, using Ar gas 200 sccm and $O_2$ gas 3 sccm with substrate temperature of 200° C. The work function of the ITO film immediately after the film forming process was about 4.35 eV but the film was subsequently irradiated with UV rays by means of a low pressure mercury lamp to raise the work function to about 4.6 eV. The film thickness was 70 nm.

Then, HHOT (hexakishexyloxytriphenylene) that is electro-conductive liquid crystal was deposited as hole injection layer by a resistance heating evaporation method in a vacuum tank after reducing the internal pressure of the tank to less than $2.7 \times 10^{-3}$ Pa. The HHOT layer was formed to a thickness of about 5 nm at a rate of about 0.1 nm/sec under $1.3 \times 10^{-3}$ Pa. The mobility of the HHOT is $1 \times 10^{-3}$ $cm^2/Vsec$ at about 70° C. or less when observed by the time of flight method. The structure of HHOT is illustrated below.

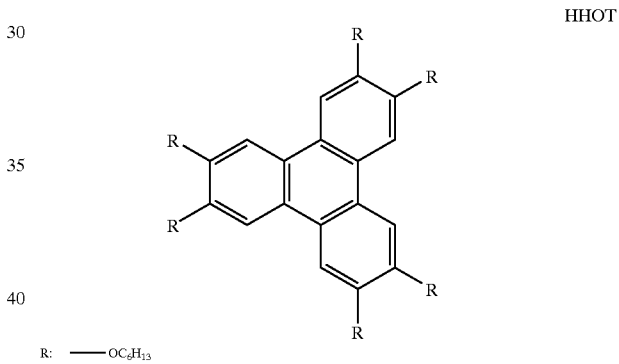

Then, a PVK film was formed as electro-conductive polymer layer that had a hole transfer property and a blue fluorescent light emitting property on the hole injection layer of electro-conductive liquid crystal to a thickness of about 20 nm by a 60° C. heating indirect spray coating method (not directly spraying onto the substrate). Toluene was used as spray solvent and diluted to 0.25 wt %.

Thereafter, a thin film of electron transfer type smectic liquid crystal (QQ77) was formed on the luminescent layer of the electro-conductive polymer to a thickness of 30 nm as electron injection layer by vacuum evaporation. The evaporation pressure was $1.33 \times 10^{-3}$ Pa and the desposition rate was about 0.1 nm/sec. The structure of QQ77a is illustrated below.

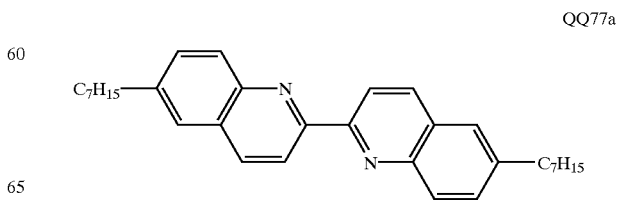

Subsequently, a 50 nm thick Al—Li alloy film (Li: 1.8 wt %) and a 150 nm thick Al film were formed as cathode on the QQ77a layer by vacuum evaporation to produce a complete organic EL element according to the invention. As a comparative example, an organic EL element was prepared without using an HHOT layer and using a 30 nm thick Alq3 layer in place of the QQ77a layer.

The organic EL element of Example 1 and that of the comparative example were heated to 65° C. that is the liquid crystal phase (discotic disordered phase) temperature of HHOT and an electric field was applied thereto in order to make them emit: light. As a result, when an electric field of 8V/100 nm was applied to the elements of this example and the comparative example, the observed luminance of emitted light was 150 cd/m$^2$ for the element of this example and 50 cd/m$^2$ for that of the comparative example.

The element of this example showed an increase in the electric current flowing through the element at 65° C. At this time, the discotic column had been oriented in a direction substantially perpendicular relative to the surface of the ITO electrode (reorientation effect: confirmed by observing specimens that had been prepared by forming a 10 nm thick cathode by means of evaporation of the cathode metal through an orthogonal polarization microscope having an orthogonal polarizer. The same result was obtained when the HHOT layer was made to have a thickness of 150 nm.) The increase in the electric current was maintained at 70° C. or above.

Example 2

An organic EL element having a configuration as shown in FIG. 2 was prepared. After forming an ITO electrode on a glass substrate as in Example 1, a mixture of DPVBi and BczVBi mixed to a weight ratio of DPVBi: BczVBi =100:3 was dissolved in chloroform to make it show a concentration of 1 wt % in PVK and the solution was spin-coated to form a 40 nm thick electro-conductive polymer layer. The structure of DPVBi and that of BczVBi are illustrated below.

Thereafter, an about 20 nm thick QQ77a film was formed by a resistance heating evaporation method in a vacuum tank after reducing the internal pressure of the tank to less than 2.66×10$^{-3}$ Pa. The evaporation pressure was 1.33×10$^{-3}$ Pa and the evaporation rate was about 0.1 nm/sec. Subsequently, an about 10 nm thick Al—Li alloy film (Li: 1.8 wt %) and an about 150 nm thick Al film were formed thereon as cathode by vacuum evaporation to produce a complete organic EL element according to the invention.

A satisfactory light emitting effect was obtained when an electric field of 10V/100 nm was applied to the obtained organic EL element at 65° C.

Example 3

After forming an ITO electrode on a glass substrate and then a luminescent layer where DPVBi and BczVBi were dispersed in PVK as in Example 2, a cotton pile blanket having a pile length of about 2 mm was wound around a circularly cylindrical drum of aluminum having a diameter of about 80 mm and said luminescent layer was subjected to a rubbing treatment under pressure that had been regulated so as to make the tips of the piles to be pushed back by 0.1 mm under conditions of 1,000 rpm of rotation of the drum and 20 mm/sec of motion of the substrate. Subsequently, a QQ77a layer and a cathode were formed on the luminescent layer as in Example 2 to produce a complete organic EL element according to the invention.

A satisfactory light emitting effect was obtained when an electric field of 10V/100 nm was applied to the obtained organic EL element at 65° C.

As described above, the carrier injection efficiency is improved and emitted light shows a high luminance without using a calcium electrode as a result of using an electro-conductive liquid crystal layer for the carrier injection layer in a polymer type organic EL element according to the invention that provides advantages in term of manufacturing process. A polymer type organic EL element according to the invention operates as excellently as low molecular weight type organic EL elements in terms of the stability and the efficiency and intensity of light emission. Additionally, since the efficiency of injecting carriers to the electro-conductive polymer layer from the corresponding electrode is improved in an electro-conductive liquid crystal element according to

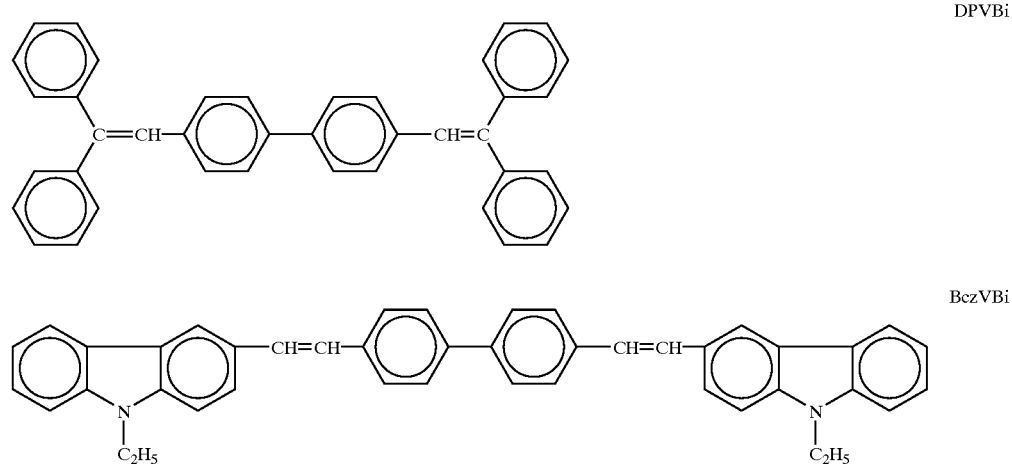

DPVBi

BczVBi the invention, it can be applied to various electronic devices to provide them with excellent characteristics.

What is claimed is:

1. An organic electroluminescence element comprising a substrate, a pair of electrodes, an organic polymer luminescent layer arranged between said pair of electrodes, and a liquid crystal layer arranged between said pair of electrodes, said organic polymer luminescent layer emitting light as an electric current flows between said electrodes, wherein said liquid crystal layer is arranged so that said liquid crystal layer is in contact with a surface of said organic polymer luminescent layer, said surface having been subjected to a rubbing treatment.

2. An organic electroluminescence element according to claim 1, wherein said liquid crystal layer is made of a discotic liquid crystal compound.

3. An organic electroluminescence element according to claim 1, wherein said liquid crystal layer is made of a smectic liquid crystal compound.

4. An organic electroluminescence element according to claim 1, wherein said organic polymer luminescent layer is made of polyvinylcarbazole.

5. An organic electroluminescence element according to claim 1, wherein said organic polymer luminescent layer contains a luminescent center substance in a dispersed state.

* * * * *